United States Patent
Morand et al.

(10) Patent No.: US 7,361,592 B2
(45) Date of Patent: Apr. 22, 2008

(54) METHOD FOR PRODUCING A COMPONENT COMPRISING AT LEAST ONE GERMANIUM-BASED ELEMENT AND COMPONENT OBTAINED BY SUCH A METHOD

(75) Inventors: Yves Morand, Grenoble (FR); Thierry Poiroux, Voreppe (FR); Maud Vinet, Rives (FR)

(73) Assignees: Commissariat a l'Energie Atomique, Paris (FR); ST Microelectronics SA, Montrouge (FR)

( * ) Notice: Subject to any disclaimer, the term of this patent is extended or adjusted under 35 U.S.C. 154(b) by 197 days.

(21) Appl. No.: 11/444,423

(22) Filed: Jun. 1, 2006

(65) Prior Publication Data

US 2006/0276052 A1   Dec. 7, 2006

(30) Foreign Application Priority Data

Jun. 6, 2005   (FR) ................................... 05 05701

(51) Int. Cl.
*H01L 21/44* (2006.01)
(52) U.S. Cl. ................... 438/652; 257/65; 423/349
(58) Field of Classification Search .................. 257/65; 423/349; 438/652
See application file for complete search history.

(56) References Cited

U.S. PATENT DOCUMENTS

| | | | | |
|---|---|---|---|---|
| 5,917,981 | A * | 6/1999 | Kovacic et al. | 385/131 |
| 6,423,632 | B1 * | 7/2002 | Samavedam et al. | 438/652 |
| 7,205,210 | B2 * | 4/2007 | Barr et al. | 438/455 |
| 2004/0115900 | A1 * | 6/2004 | Huang et al. | 438/458 |
| 2004/0219767 | A1 * | 11/2004 | Arena et al. | 438/479 |
| 2005/0156268 | A1 * | 7/2005 | Chu | 257/478 |
| 2005/0181549 | A1 * | 8/2005 | Barr et al. | 438/150 |
| 2005/0218453 | A1 * | 10/2005 | Langdo et al. | 257/352 |
| 2005/0224875 | A1 * | 10/2005 | Anderson et al. | 257/347 |
| 2007/0023756 | A1 * | 2/2007 | Anderson et al. | 257/65 |

FOREIGN PATENT DOCUMENTS

FR   2 852 144   9/2004
WO   WO 2004/001810 A2   12/2003

OTHER PUBLICATIONS

Tezuka et al., "High-Mobility Strained SiGe-on-Insulator pMOSFETs With Ge-Rich Surface Channels Fabricated by Local Condensation Technique," IEEE Electron Device Letters, vol. 26, No. 4, Apr. 2005, pp. 243-245.

Nakaharai et al., "Characterization of 7-nm-thick strained Ge-on-insulator layer fabricated by Ge-condensation technique," Applied Physics Letters, vol. 83, No. 17, Oct. 2003, pp. 3516-3518.

* cited by examiner

*Primary Examiner*—Fernando L Toledo
(74) *Attorney, Agent, or Firm*—Oliff & Berridge, PLC

(57) ABSTRACT

The method successively comprises production, on a substrate, of a stack of layers comprising at least one first layer made from germanium and silicon compound initially having a germanium concentration comprised between 10% and 50%. The first layer is arranged between second layers having germanium concentrations comprised between 0% and 10%. Then a first zone corresponding to the germanium-based element and having at least a first lateral dimension comprised between 10 nm and 500 nm is delineated by etching in said stack. Then at least lateral thermal oxidation of the first zone is performed so that a silica layer forms on the surface of the first zone and that, in the first layer, a central zone of condensed germanium forms, constituting the germanium-based element.

10 Claims, 6 Drawing Sheets

METHOD FOR PRODUCING A COMPONENT COMPRISING AT LEAST ONE GERMANIUM-BASED ELEMENT AND COMPONENT OBTAINED BY SUCH A METHOD

BACKGROUND OF THE INVENTION

The invention relates to a method for producing a component comprising at least one germanium-based element, the method comprising fabrication, on a substrate, of a stack of layers comprising at least one first layer made of germanium and silicon compound, the first layer being arranged between second layers.

STATE OF THE ART

Germanium is an interesting material for producing microelectronic components such as field effect transistors, single-electron transistors or memories for example, and also for producing electromechanical components and bio-components, for example DNA chips. Pure germanium presents a mobility twice as great for electrons and four times as great for holes than silicon. The drawback of germanium transistors is the cost of the substrate which is about ten times higher than that of a bulk silicon substrate. Furthermore, it is very difficult to stack several germanium channels by epitaxy of good quality germanium on a silicon substrate. Moreover, fabrication of these transistors requires numerous developments due to the instability of germanium oxide.

Germanium channels or dots on insulator, i.e. two-dimensional and three-dimensional nanometric germanium elements, are sought to be produced. These elements can be arranged directly on an insulating layer or by means of another material, for example a gate material in the case of a transistor.

A known technique for fabricating germanium on insulator layers is the germanium condensation technique, as described for example in the article "Characterization of 7-nm-thick strained Ge-on-insulator layer fabricated by Ge-condensation technique" by S. Nakaharai et al. (Applied Physics letters volume 83 number 17; 27 October 2003). The technique consists in oxidizing a stack of layers respectively made from silicon and a silicon and germanium compound SiGe. This stack of layers is itself arranged on a dielectric. When oxidization takes place, the germanium content of the SiGe layer increases and can exceed 99%. This technique is suitable for fabrication of germanium-on-insulator substrates. However, this technique presents the drawback of it being difficult to intercalate a layer of another material, for example a gate material, between the insulator and the germanium.

OBJECT OF THE INVENTION

It is an object of the invention to remedy these shortcomings and to propose a method for producing germanium dots and channels, which may be superposed, while using standard methods, for example methods for integrating transistors on silicon.

According to the invention, this object is achieved by the fact that, the first layer made of germanium and silicon compound initially having a germanium concentration comprised between 10% and 50%, the second layers having germanium concentrations comprised between 0% and 10%, the method successively comprises:

delineation by etching, in said stack, of a first zone corresponding to the germanium-based element and having at least a first lateral dimension comprised between 10 nm and 500 nm, and at least lateral thermal oxidization of the first zone, so that a silica layer forms on the surface of the first zone, and wherein, in the first layer, a central zone of condensed germanium forms, constituting the germanium-based element.

It is a further object of the invention to provide a component comprising at least one germanium-based element and produced by a method according to the invention.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

Figure 1:
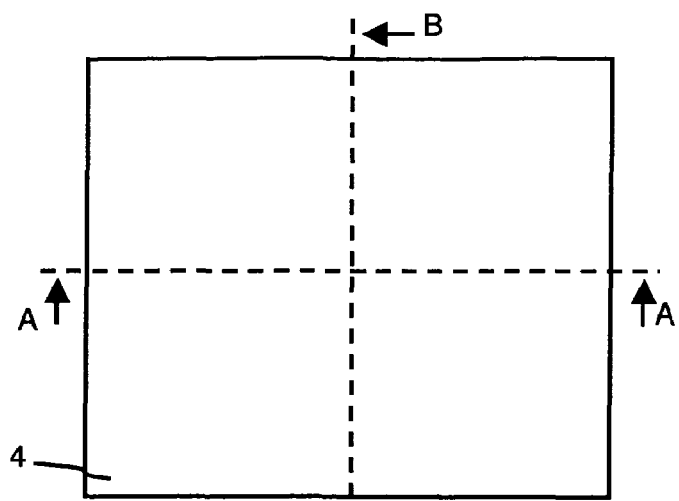
FIGS. 1 to 9 represent three steps of a first particular embodiment of the method according to the invention, respectively in top view (FIGS. 1, 4 and 7), in cross-section along the line B-B (FIGS. 2, 5 and 8) and in cross-section along the line AA (FIGS. 3, 6 and 9).
Figure 2:
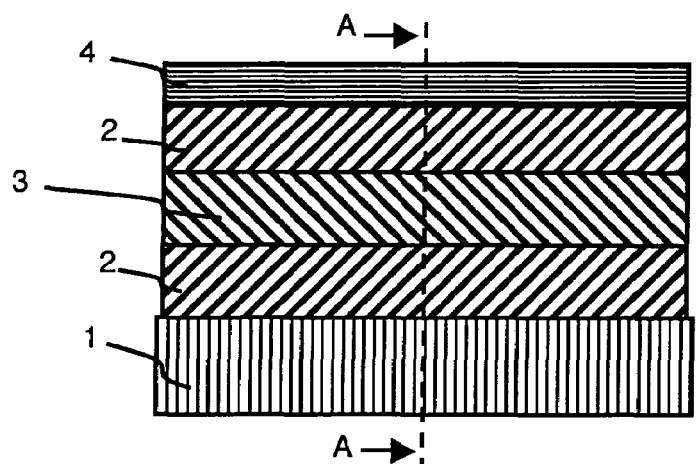
Figure 3:
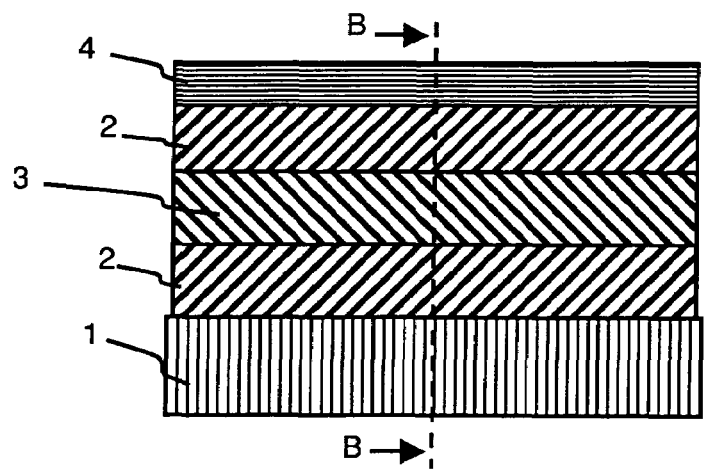

FIGS. 1 to 3 represent fabrication, on a substrate 1, for example made from silicon Si, of a stack of alternate first (3) and second (2) layers of germanium and silicon compound GeSi. The alternate layers 3 and 2 respectively have first and second germanium concentrations. The first germanium concentration is comprised between 10% and 50% and is preferably 30% and the second concentration is comprised between 0% and 10% and is preferably 0%. In FIGS. 2 and 3, a first layer 3 is arranged between two second layers 2. The stack can be achieved for example by SiXGe(1-X)/SiYGe(1-Y) hetero-epitaxy on a silicon or silicon on insulator (SOI) substrate. The thickness of the SiGe layers 2 and 3 is chosen, in known manner, such that the critical plastic relaxation thickness is not exceeded for the germanium concentrations used. For example, the thickness of a layer is comprised between 10 nm and 100 nm for a SiGe layer comprising 25% of germanium. The number of the first SiGe layers 3 determines the number of germanium-based elements formed by the method.

The method preferably comprises deposition of a passivation layer 4 on a front face of the stack of layers 2 and 3, before going on to a next step of etching of the stack. The passivation layer 4 is for example a layer of silicon nitride (Si3N4) enabling the front face of the stack to be protected against subsequent oxidization.

Figure 4:
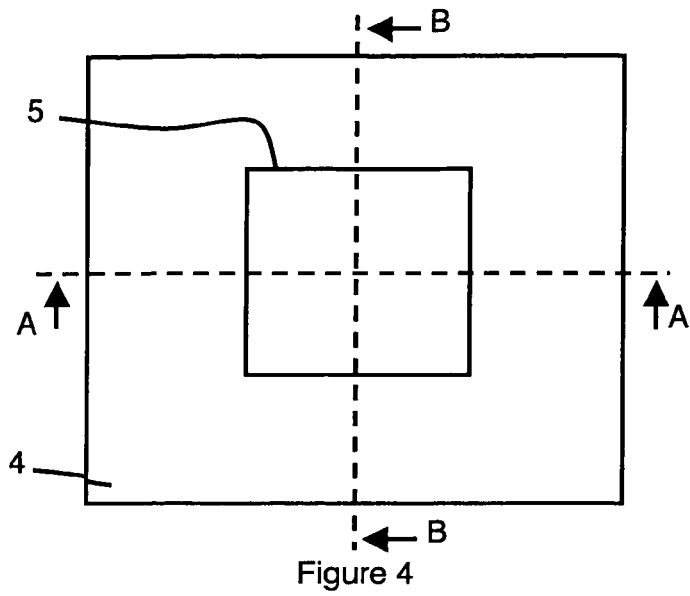
Figure 5:
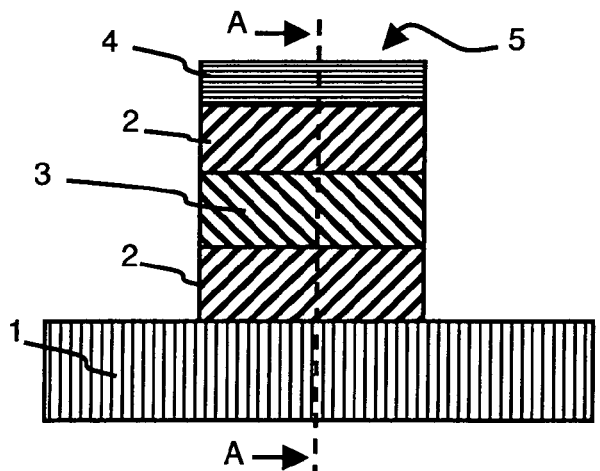
Figure 6:
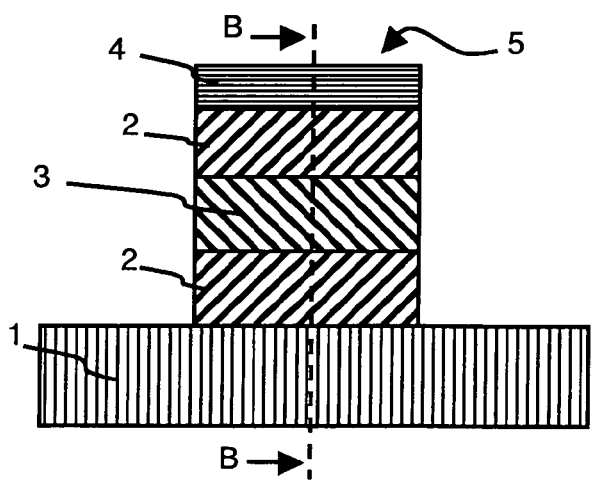

FIGS. 4 to 6 illustrate delineation by etching, in said stack, of a first zone 5 having two lateral dimensions comprised between 10 nm and 500 nm, notably a first lateral dimension along the line A-A and a second lateral dimension along the line B-B, in FIG. 4. The first zone 5 is delineated for example, in known manner, by deposition of a photoresist, photolithography of the photoresist, anisotropic plasma etching of the stack of layers and removal of the photoresist.

Figure 7:
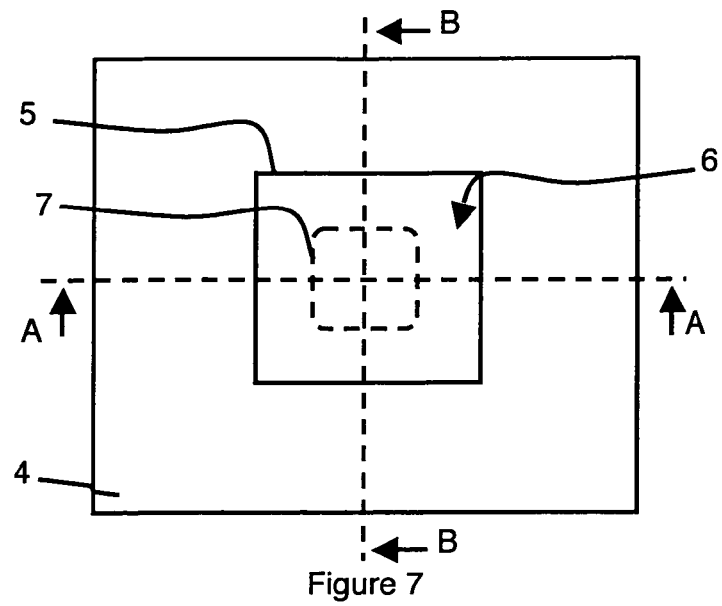
Figure 8:
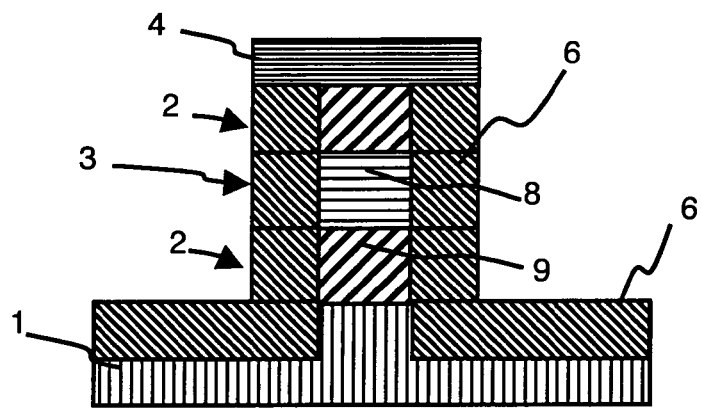
Figure 9:
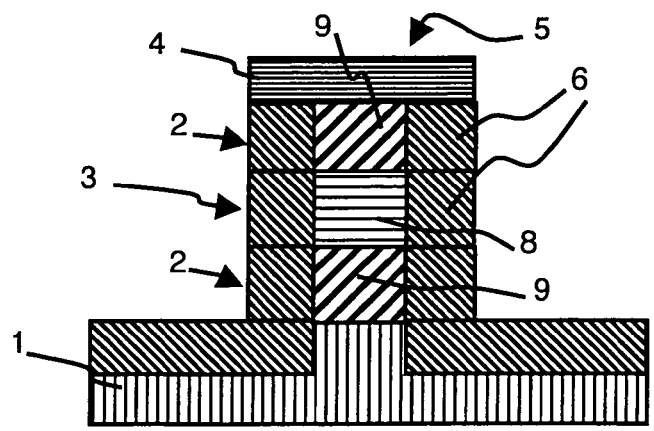

FIGS. 7 to 9 illustrate a step of at least lateral superficial thermal oxidization of the first zone 5 so that a layer 6 of silica (SiO2) forms on the surface of the zone 5. When a passivation layer 4 is deposited on the front face of the stack of layers, the silica layer 6 forms on the side faces of the stack and possibly on the front face of the substrate 1, if the substrate 1 is for example made of silicon Si. The passivation layer 4 thus prevents complete oxidization of the front face of the top second layer 2 of the stack of alternate layers.

In this embodiment, as represented by the broken line 7 in FIG. 7, the silica layer 6 forms superficially. Oxygen enters into the stack of layers down to a predetermined depth represented by the broken line 7. The inside of the first zone 5 is therefore not necessarily oxidized when thermal oxidization takes place. Superficial thermal oxidization is performed so that a central zone 8 of condensed germanium forms in the first layer 3 initially having the first germanium concentration. The central zone 8 of condensed germanium constitutes the germanium-based element, for example in the form of a dot. When only the first lateral dimension of the first zone 5 is comprised between 10 nm and 500 nm and a second lateral dimension is greater than 500 nm, for example 1000 nm, the first zone 5 presents an elongate shape and the corresponding central zone 8 of condensed germanium constitutes an elongate germanium-based element, for example in the form of a channel.

In the second layers 2 initially having the second germanium concentration, residual central zones 9 of SiGe may present a different germanium concentration from the initial concentration. Indeed, the central zones 9 of the second layers 2 can become germanium-enriched to the detriment of the surface of the second layers 2 which is transformed into silica (the silica layer 6). These phenomena depend, in known manner, on the initial germanium concentrations and on the parameters used for the oxidization step, for example on the temperature, the oxidization time, etc . . . In particular, the central zones 9 of the second layers 2 may be completely oxidized.

In a second particular embodiment, represented in FIGS. 10 to 15, the stack of alternate layers comprises two first layers 3a and 3b having the first germanium concentration and two second layers 2a and 2b having the second germanium concentration. The bottom first layer 3a is arranged on the substrate 1. The second layers 2a and 2b and the substrate 1 are preferably made of pure silicon (Si). Thus, the top first layer 3b of the stack is arranged between the two second silicon layers 2a and 2b and the bottom first layer 3a is arranged between the bottom second silicon layer 2a and the silicon substrate 1.

Figure 10:
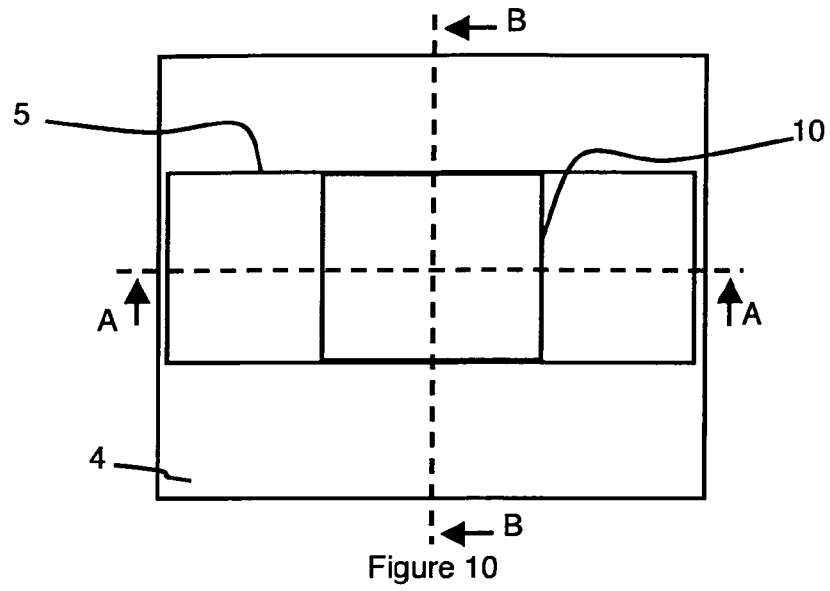
FIGS. 10 to 15 represent two steps of a second particular embodiment of the method according to the invention, respectively in top view (FIGS. 10 and 13), in cross-section along the line B-B (FIGS. 11 and 14) and in cross-section along the line AA (FIGS. 12 and 15).
Figure 11:
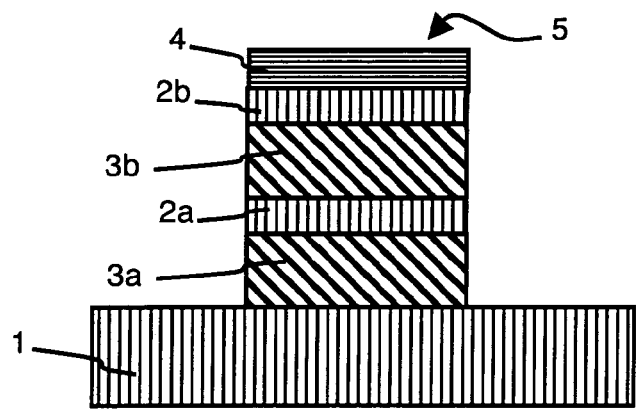
Figure 12:
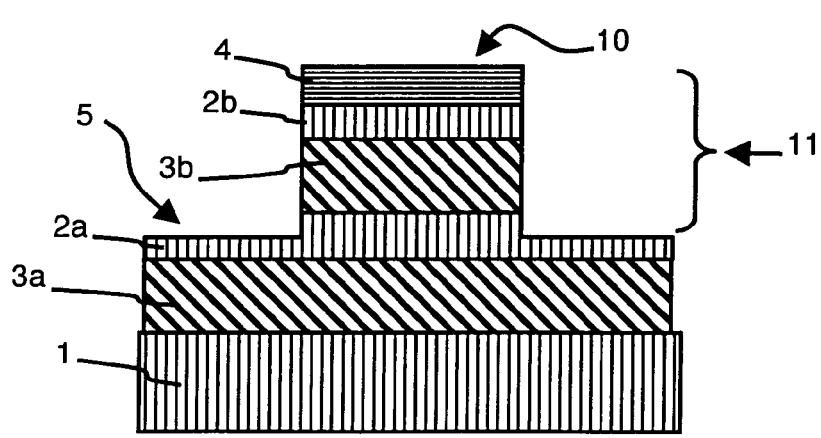

As represented in FIGS. 10 to 12, a first zone 5 elongate along the line A-A is delineated in the stack of alternate layers. The first elongate zone 5 has the first, small lateral dimension comprised between 10 nm and 500 nm and a second, large, lateral dimension larger than 500 nm, for example 1000 nm. Then a second zone 10 is delineated by etching in a top part 11 of the first zone 5. The top part 11 of the first zone 5 comprises the top first layer 3b of the two first layers 3 having the first germanium concentration and therefore the top layer 2b of the two second layers 2. Etching corresponding to the second zone 10 is stopped half-way between the two first layers 3a and 3b, at the level of the bottom second layer 2a, for example when half of the latter has been etched. Thus, the second zone 10 has two, small, lateral dimensions comprised between 10 nm and 500 nm. Etching of the second zone 10 can, as previously, be performed for example by deposition of a photoresist, photolithography of the photoresist, anisotropic plasma etching and removal of the photoresist.

Figure 13:
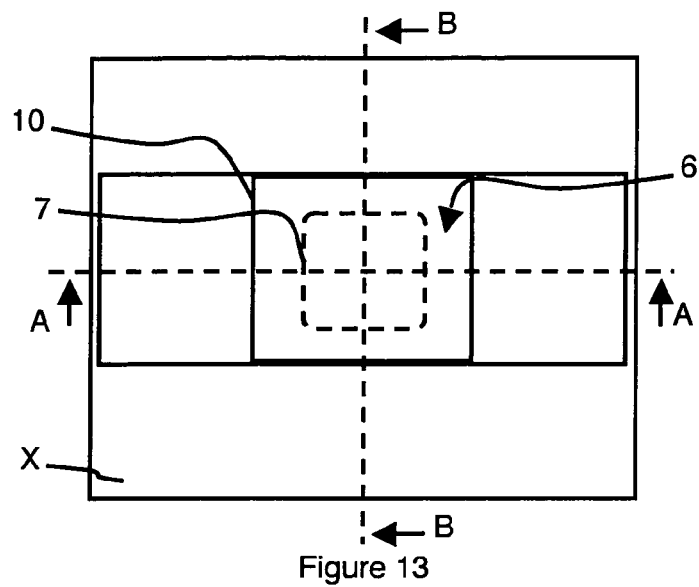
Figure 14:
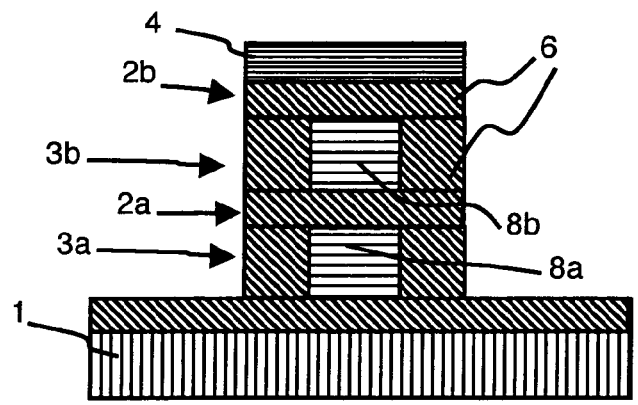
Figure 15:
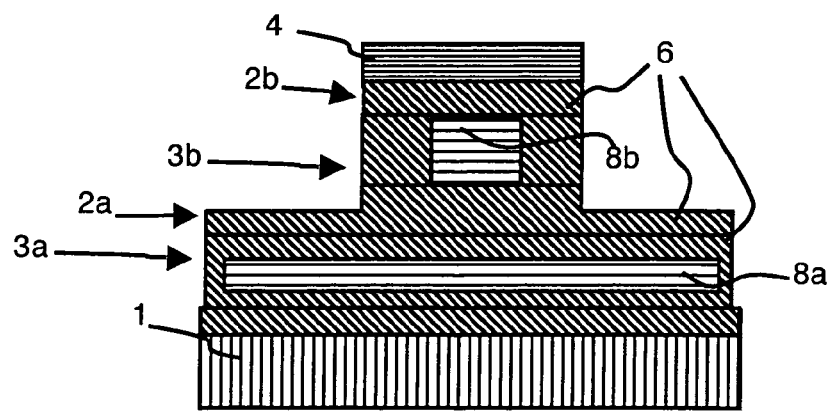

FIGS. 13 to 15 illustrate thermal oxidization performed such that a silica layer 6 forms on the surface of the first (5) and second (10) zones and that, in the first layers 3a and 3b initially having the first germanium concentration, central zones 8a and 8b of condensed germanium respectively form. In this particular embodiment, the silicon of the second layers 2a and 2b is completely oxidized during oxidization. The substrate 1 is oxidized on the front face thereof. The central zones 8a and 8b of condensed germanium of the bottom first layer 3a and top first layer 3b respectively constitute a germanium channel and a germanium dot, respectively corresponding to the first (5) and second (10) zone. A component is then obtained comprising two silica-coated germanium-based elements.

Figure 16:
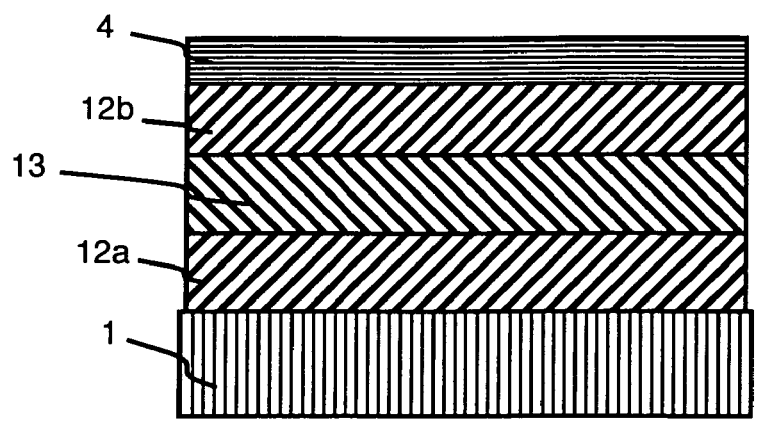
FIGS. 16 to 18 illustrate three other particular embodiments of the method according to the invention.

According to the invention, the stack of layers comprises at least one first layer of germanium and silicon compound initially having a germanium concentration comprised between 10% and 50%. The first layer is arranged between the second layers having germanium concentrations comprised between 0% and 10%. A periodic alternation of layers is therefore not necessarily involved. As represented in FIG. 16, the stack comprises at least one first layer 13 of SiGe having an initial germanium concentration comprised between 10% and 50%. The first layer 13 is arranged between second layers 12a and 12b having germanium concentrations comprised between 0% and 10%. The layer 12a and/or layer 12b can for example be formed by silica (SiO2), silicon (Si), by silicon nitride (Si3N4) or by a compound of germanium and silicon having a germanium concentration comprised between 0% and 10%.

As previously, at least lateral thermal oxidization of the first zone 5 is performed so that the central zone 8 of condensed germanium forms in the first layer 13. The first and/or second layers are preferably doped to increase the oxidization kinetics.

Figure 17:
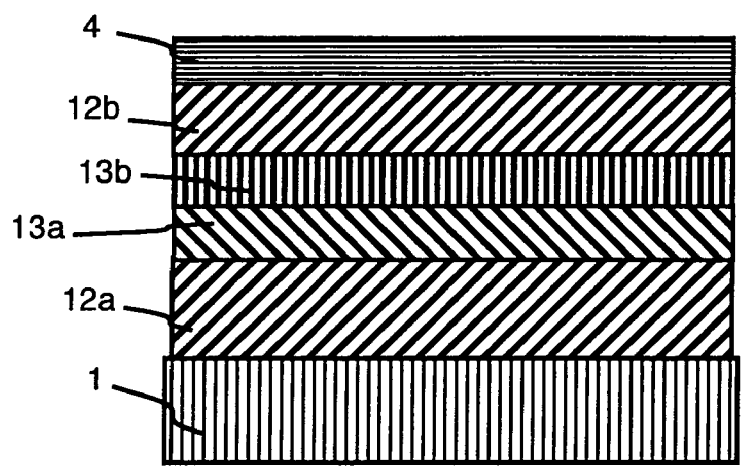

Moreover each of the layers 12a, 12b and 13 can be formed by several sub-layers fulfilling the above germanium concentration conditions. In FIG. 17, for example, the first layer 13 is formed by two sub-layers 13a and 13b. For example, when the two sub-layers 13a and 13b have different germanium concentrations, the germanium-based element obtained is a superposition of two parties having different vertical dimensions and germanium concentrations. Moreover, a first layer 13 can be directly arranged on the substrate 1, when the latter presents a germanium concentration of less than 10%. Thus, the substrate 1 constitutes one of the second layers.

Figure 18:
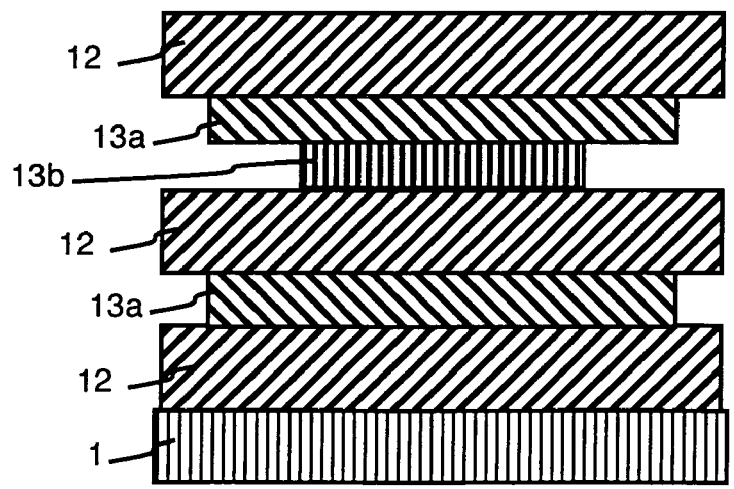

As represented in FIG. 18, the lateral dimensions of the first and second layers can be adjusted, before condensation, for example by selective isotropic etching depending on the germanium concentration. In FIG. 18, the second layers 12 are made of $SiGe_z$ and have a germanium concentration comprised between 0 and 10%. The first layers 13 are made from $SiGe_x$ (13a) and $SiGe_y$ (13b) and have germanium concentrations comprised between 10 and 50%, that of $SiGe_y$ (13b) being higher than that of $SiGe_x$ (13a).

The invention is not limited to the particular embodiments represented. In particular, the number of channels and/or of dots can be more than two. For example several germanium channels can be produced by means of a stack comprising several first layers. Several germanium dots can be arranged in aligned manner above a single germanium channel. The final dimensions of the germanium elements depend on the initial dimensions of the first (5) and second (10) zones, on the thicknesses of the first layers and on the initial germanium concentrations of the first layers. Channels of different dimensions can be superposed.

The invention claimed is:

1. Method for producing a component comprising at least one germanium-based element, the method comprising fabrication, on a substrate, of a stack of layers comprising at least one first layer made of germanium and silicon compound, the first layer being arranged between second layers, method wherein, the first layer made of germanium and silicon compound initially having a germanium concentration comprised between 10% and 50%, the second layers having germanium concentrations comprised between 0% and 10%, the method successively comprises:

delineation by etching, in said stack, of a first zone corresponding to the germanium-based element and having at least a first lateral dimension comprised between 10 nm and 500 nm, and at least lateral thermal oxidization of the first zone, so that a silica layer forms on the surface of the first zone, and wherein, in the first layer, a central zone of condensed germanium forms, constituting the germanium-based element.

2. Method according to claim 1, comprising deposition of a passivation layer on the stack of layers, before delineation by etching.

3. Method according to claim 1, wherein the first and/or second layers are doped.

4. Method according to claim 1, wherein the stack of layers is formed by an alternation of first and second layers of germanium and silicon compound respectively having first and second germanium concentrations.

5. Method according to claim 4, wherein the first germanium concentration is 30% and the second concentration is 0%.

6. Method according to claim 4, wherein the stack of alternate layers comprises a first layer and two second layers.

7. Method according to claim 4, wherein the stack of alternate layers comprises two first layers and two second layers, one of the two first layers being arranged directly on the substrate.

8. Method according to claim 7, wherein a second lateral dimension of the first zone is greater than 500 nm and the method comprises delineation by etching, in a top part of the first zone comprising the top layer of the two first layers, of a second zone having two lateral dimensions comprised between nm and 500 nm.

9. Method according to claim 8, wherein the etching for delineation of the second zone is stopped half-way between the two first layers.

10. Component comprising at least one germanium-based element, wherein it is produced by a method according to claim 1.

* * * * *